(12) United States Patent
Goetz et al.

(10) Patent No.: US 10,135,481 B2
(45) Date of Patent: Nov. 20, 2018

(54) RADIO FREQUENCY SHIELDING WITHIN A SEMICONDUCTOR PACKAGE

(71) Applicant: Intel IP Corporation, Santa Clara, CA (US)

(72) Inventors: Edmund Goetz, Dachau (DE); Bernd Memmler, Riemerling (DE); Jan-Erik Mueller, Ottobrunn (DE); Peter Baumgartner, Munich (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/174,545

(22) Filed: Jun. 6, 2016

(65) Prior Publication Data

US 2016/0359520 A1    Dec. 8, 2016

Related U.S. Application Data

(63) Continuation of application No. 13/931,902, filed on Jun. 29, 2013, now Pat. No. 9,362,233.

(51) Int. Cl.
*H04B 1/40* (2015.01)
*H01L 23/552* (2006.01)
(Continued)

(52) U.S. Cl.
CPC ........... *H04B 1/40* (2013.01); *H01L 21/6835* (2013.01); *H01L 23/04* (2013.01); *H01L 23/3128* (2013.01); *H01L 23/481* (2013.01); *H01L 23/5384* (2013.01); *H01L 23/5386* (2013.01); *H01L 23/5389* (2013.01); *H01L 23/552* (2013.01); *H01L 23/66* (2013.01); *H01L 24/17* (2013.01); *H01L 24/19* (2013.01); *H01L 24/24* (2013.01); *H01L 24/32* (2013.01); *H01L 24/49* (2013.01); *H01L 24/73* (2013.01); *H01L 24/96* (2013.01); *H01L 25/0655* (2013.01); *H01L 25/0657* (2013.01); *H01L 25/18* (2013.01); *H01L 25/50* (2013.01); *H01L 23/36* (2013.01); *H01L 23/49816* (2013.01); *H01L 24/48* (2013.01); *H01L 2223/6644* (2013.01); *H01L 2224/0401* (2013.01);
(Continued)

(58) Field of Classification Search
None
See application file for complete search history.

(56) References Cited

U.S. PATENT DOCUMENTS

| 9,362,233 B2 * | 6/2016 | Goetz ................. H01L 23/552 |
| 2006/0091517 A1 | 5/2006 | Yoo et al. |
| 2008/0315376 A1 | 12/2008 | Tang et al. |

FOREIGN PATENT DOCUMENTS

KR   1020100015131 A    2/2010

OTHER PUBLICATIONS

"U.S. Appl. No. 13/931,902, Corrected Notice of Allowance dated Mar. 21, 2016", 6 pgs.
(Continued)

*Primary Examiner* — Hrayr A Sayadian
(74) *Attorney, Agent, or Firm* — Schwegman Lundberg & Woessner, P.A.

(57) ABSTRACT

Radio frequency shielding within a semiconductor package is described. In one example, a multiple chip package has a digital chip, a radio frequency chip, and an isolation layer between the digital chip and the radio frequency chip. A cover encloses the digital chip and the radio frequency chip.

12 Claims, 4 Drawing Sheets

(51) Int. Cl.
*H01L 23/31* (2006.01)
*H01L 23/538* (2006.01)
*H01L 23/00* (2006.01)
*H01L 25/065* (2006.01)
*H01L 25/18* (2006.01)
*H01L 21/683* (2006.01)
*H01L 23/04* (2006.01)
*H01L 23/48* (2006.01)
*H01L 23/66* (2006.01)
*H01L 25/00* (2006.01)
*H01L 23/36* (2006.01)
*H01L 23/498* (2006.01)

(52) U.S. Cl.
CPC .......... *H01L 2224/04042* (2013.01); *H01L 2224/04105* (2013.01); *H01L 2224/12105* (2013.01); *H01L 2224/14181* (2013.01); *H01L 2224/16145* (2013.01); *H01L 2224/16225* (2013.01); *H01L 2224/24145* (2013.01); *H01L 2224/24146* (2013.01); *H01L 2224/32145* (2013.01); *H01L 2224/32225* (2013.01); *H01L 2224/32245* (2013.01); *H01L 2224/48091* (2013.01); *H01L 2224/48106* (2013.01); *H01L 2224/48227* (2013.01); *H01L 2224/73265* (2013.01); *H01L 2224/73267* (2013.01); *H01L 2225/0651* (2013.01); *H01L 2225/06513* (2013.01); *H01L 2225/06517* (2013.01); *H01L 2225/06537* (2013.01); *H01L 2225/06541* (2013.01); *H01L 2225/06558* (2013.01); *H01L 2225/06565* (2013.01); *H01L 2225/06568* (2013.01); *H01L 2225/06589* (2013.01); *H01L 2924/00014* (2013.01); *H01L 2924/01029* (2013.01); *H01L 2924/143* (2013.01); *H01L 2924/1421* (2013.01); *H01L 2924/1434* (2013.01); *H01L 2924/15311* (2013.01); *H01L 2924/181* (2013.01); *H01L 2924/3025* (2013.01)

(56) References Cited

OTHER PUBLICATIONS

"U.S. Appl. No. 13/931,902, Non Final Office Action dated Aug. 5, 2015", 8 pgs.
"U.S. Appl. No. 13/931,902, Notice of Allowance dated Feb. 23, 2016", 8 pgs.
"U.S. Appl. No. 13/931,902, Response filed Apr. 8, 2015 to Restriction Requirement dated Mar. 27, 2015", 5 pgs.
"U.S. Appl. No. 13/931,902, Response filed Oct. 5, 2015 to Non Final Office Action dated Aug. 5, 2015", 10 pgs.
"U.S. Appl. No. 13/931,902, Restriction Requirement dated Mar. 27, 2015", 10 pgs.

\* cited by examiner

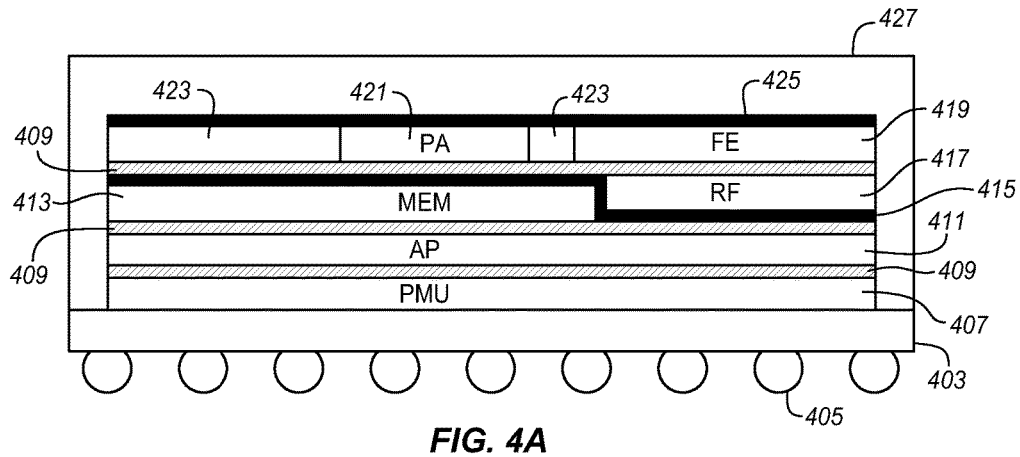
FIG. 4A
FIG. 4B
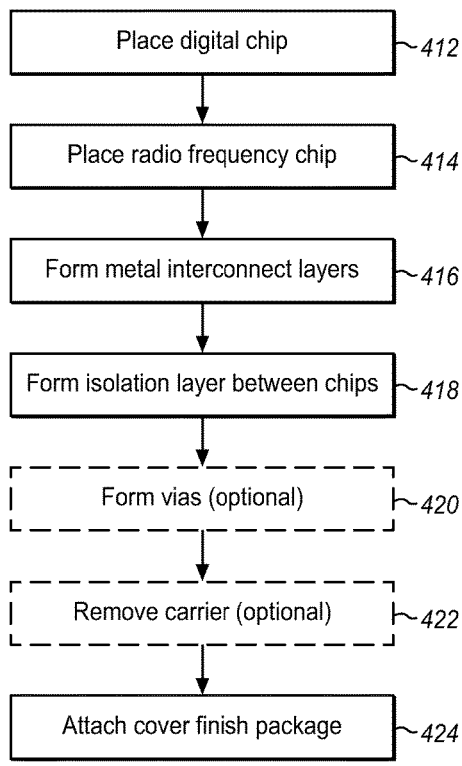

RADIO FREQUENCY SHIELDING WITHIN A SEMICONDUCTOR PACKAGE

CROSS-REFERENCE TO RELATED APPLICATION

The present application is a continuation of prior U.S. Pat. No. 9,362,233, issued Jun. 7, 2016, entitled "RADIO FREQUENCY SHIELDING WITHIN A SEMICONDUCTOR PACKAGE," by Edmund Goetz, et the priority of which is hereby claimed and the contents of which are hereby incorporated by reference herein.

FIELD

The present disclosure relates to the field of multiple chip packaging and, in particular, to placing chips of different types into a single package.

BACKGROUND

Semiconductor and micromechanical dies or chips are frequently packaged for protection against an external environment. The package provides physical protection, stability, external connections, and in some cases, cooling to the die inside the packages. Typically the die is attached to a substrate and then a cover that attaches to the substrate is placed over the die. While there is a trend to add more functions to each die, there is also a trend to put more than one chip in a single package. Since a package is typically much larger than the die that it contains, additional dies can be added without significantly increasing the size of the package. Current packaging technologies include stacking dies on top of each other and placing dies side-by-side on a single package substrate. Consolidating more functions into a single die and placing more dies into a single package are ways to reduce the size of the electronics and micromechanics in a device.

Some desktop and notebook systems already combine a central processing unit and a graphics processor in a single package. In other cases, a memory die is combined in a package with a processor. For portable devices, more dies may be added to a package to form what is referred to as a complete SiP (System in a Package).

As wireless connectivity is expanded to more devices and the sizes of these devices are reduced, RF (Radio Frequency) packages are placed ever closer to digital and baseband packages. The digital and baseband packages typically generate noise and interference that can disrupt or impair the operation of the RF systems. As a result, the RF modem is typically shielded by a metal case that covers the package or is a part of the package to avoid interference from the digital circuitry.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 4A is a cross sectional side view diagram of a multiple chip package with stacked and side-by-side dies according to an embodiment.

FIG. 4B is a process flow diagram of forming a multiple chip package according to an embodiment.

DETAILED DESCRIPTION

RF, digital, and baseband chips fabricated in different chip processes are often packaged and the packages are placed on a single PCB (Printed Circuit Board). For even smaller form factors, these chips can be combined together into a common package. Metal shields can be used to prevent the digital chips from interfering with the RF circuitry. Digital circuitry and the power supplies for such circuitry may operate at frequencies of from 500 MHz to 3 Ghz. A single digital chip may have millions of switches operating at these frequencies and creating noise at these frequencies and at the overtones of these frequencies. This noise can radiate from the digital circuitry into other parts of a package or even a system. These frequencies are in or close to the radio frequency ranges that are used by electronic systems for wireless communications. As a result, antennas, filters, multiplexers, modulators, up and down converters, and amplifiers or gain stages can all be impacted by the noise generated by a nearby digital chip.

Mobile communication systems and wireless connectivity devices have several chips like application processors, memories, BB (Baseband) communication processors, and the RF modem. On a mobile PCB, the RF modem is typically separated out from the other components and shielded by a metal case to avoid interference from the digital circuitry. The system can be made smaller by incorporating the whole system in one package. This creates difficulties in shielding the RF sub-system that is inside the same package with the digital and baseband system.

As described herein, different chips forming part of or even a complete mobile system are packaged together as a SiP (System in a Package). The sensitive RF modem may be isolated by shield layers of metal or another appropriate material to reduce the impact of the aggressive digital circuits which are clocked with frequencies lying in the RF frequency ranges.

The package and shielding allow several chips to be combined to form a complete mobile system in a single package. The package can include the RF modem which is sensitive to the interference coming from the operation of the digital circuits. The chips that contain the digital circuits might be an application processor, a memory, a power management unit, a baseband signal processing circuit and any of a variety of other different chips.

Rather than using discrete isolation layers, the sensitive RF chips may be shielded with isolation layers embedded around the RF sub-system. Interconnects between the different chips within the package may bypass the shielding layer or be routed through an uncritical cut-out of the shield, The shield may be coupled by some routing or wire connection to a common shielding ground which is connected to the PCB ground layer. In this way, the isolation of the RF macros is improved avoiding crosstalk from the aggressive digital circuits to the sensitive RF functionalities.

Figure 1A:
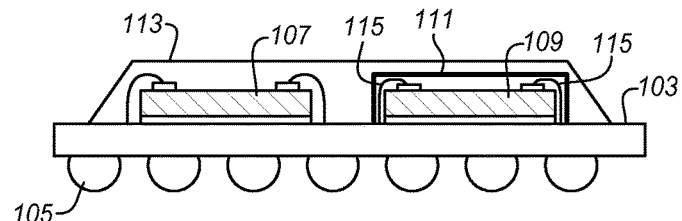
FIG. 1A is a cross sectional side view diagram of a multiple chip wire bonded package according to an embodiment.

FIG. 1A is a cross sectional side view diagram of a multiple chip package. The package has a substrate 103 and a ball grid array 105 coupled to the substrate. The substrate carries at least two dies 107, 109. One of the dies is a digital circuit and the other die is a radio frequency circuit. The dies are contained in the package and protected by a cover 113. The cover may be a metal or plastic cover or it may be formed of a molding compound or any other suitable cover material. In the example of FIG. 1A, the dies are wire bonded to the substrate and one of the dies is covered with a metal shield 111. Either the digital die or the RF die may be covered by the shield or both dies may be covered by the shield. The shield acts as an isolation layer formed over one of the dies inside the package. The isolation layer may be formed by chemical vapor deposition, by electroless plating, by electrolytic plating or in any of a variety of other ways. The isolation layer may be formed of a metal such as copper or aluminum or of any other suitable RF shielding material. Carbon, graphite or any other metal compositions may be used.

The right side die 109 may be a digital circuit or an RF circuit and is shown as connected to the package substrate using wire leads 115. While the wire leads are shown as being contained within the isolating shield, the wires may extend through the shield through vias or access holes. The wire leads may connect to the substrate 103 outside the shield or inside the shield.

Figure 1B:
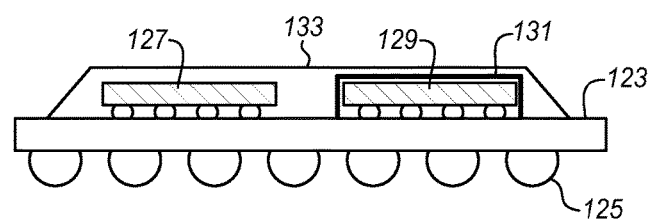
FIG. 1B is a cross sectional side view diagram of a multiple chip flip chip package according to an embodiment.

FIG. 1B is a cross sectional side view diagram of a flip chip package. The package has a substrate 123 to which two dies 127, 129 are attached using a land grid array, a C4 (Controlled Collapse Chip Connection) array, or any other suitable flip type connection system. The dies are protected by a cover 133 similar to the cover 113 of the wire bonded package. In addition, as in the example of FIG. 1A, one of the dies or both of the dies is isolated by an isolation layer 131. The isolation layer may be over the RF die, the digital die, or both to isolate one of the dies from the other.

Figure 2A:
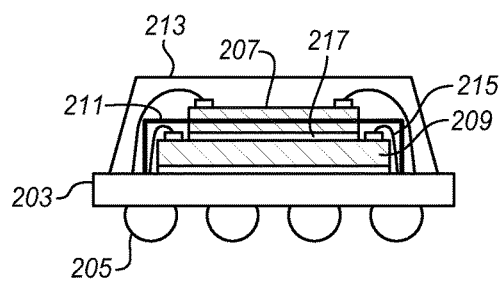
FIG. 2A is a cross sectional side view diagram of a multiple chip stacked wire bonded package according to an embodiment.

FIG. 2A is a cross sectional side view diagram of a wire bonded package in which the dies are stacked one on top of the other. The package has a substrate 203 to which a ball grid array 205 is connected for connection to a PCB (Printed Circuit Board) or another external device. A first 207 and a second 209 die are placed on top of the substrate 203 and separated by a dielectric layer 217 or layers internal to the die provided for isolation from the external environment or other dies. The dies connect to the substrate electrically using wires 215. A cover 213 encloses the dies and attaches to the substrate for protection from the external environment and from shock. An isolation layer 211 is formed over one of the dies to isolate radio frequency noise from one of the dies or, in other words, to prevent the operation of one of the dies from interfering with the other die. In the illustrated example the RF die is first placed on the substrate 209 and connected to the substrate electrically using the wire leads 215. Then the isolation layer 211 is placed, formed, or deposited over the RF die. Alternatively, the isolation layer 211 may be formed directly over the die and then the wire leads 215 connected through vias, holes or some other pathway to the die. Finally, the second die 207 is placed over the first die and over the isolation layer.

Figure 2B:
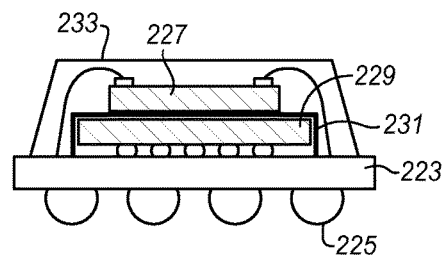
FIG. 2B is a cross sectional side view diagram of a multiple chip flip chip package according to an embodiment.

FIG. 2B is a cross sectional side view in which a first die 229 is attached to a substrate 223 as a flip chip package. The placed die is then covered or surrounded by an isolation layer 231. A second die 227 is placed over the isolation layer and the first die. The second die is attached to the substrate using wire leads. This forms a combination flip chip and wire bonding stack. The stack is protected by a cover 233. As in the other examples, the substrate is coupled to some sort of external connection 225 such as a ball grid array. In each of the examples described above, the substrate may have simple connections it may form a redistribution layer. It may have multiple metal interconnect layers. It may serve as a fan-out layer or it may include additional interposers, transformers, or other devices incorporated into the substrate or placed next to the substrate.

Figure 2C:
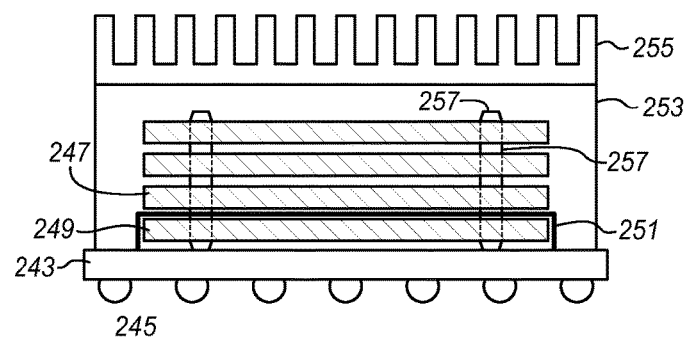
FIG. 2C is a cross sectional side view diagram of a stacked multiple chip package according to an embodiment.

FIG. 2C is a side cross sectional view of an alternative package configuration in which dies are stacked. The stacked dies are connected through silicon vias 257 to each other and also to the substrate 243. The substrate 243, similar to those described above, includes a connection system 245 to external devices. A first die 249 is attached to the substrate and electrically connected using vias 257. The die is isolated by an isolation layer 251 and a second die 247 is stacked on top of the first die. Additional dies may be placed on top of the first two dies to finish the complete system. A cover 253 is attached to the substrate to contain the dies and a heat spreader or heat sink 255 is placed above the cover for cooling the dies within the package. While only one die is shown as being protected by the isolation layer 251, additional ones of the dies may be protected or all of the dies may be protected. A single isolation layer may surround one or more dies. The additional isolation layers may be used to isolate noise from each other die. The isolation layers may also be used as ground or power planes depending on the particular implementation.

Figure 3A:
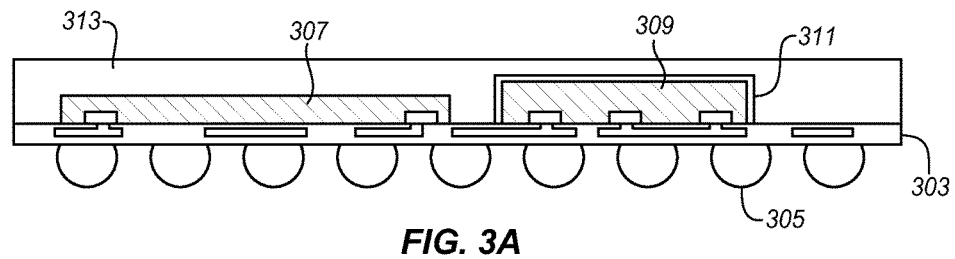
FIG. 3A is a cross sectional side view diagram of a multiple chip embedded wafer level ball grid array package according to an embodiment.

FIG. 3A shows an embedded wafer level ball grid array (eWLB) package in which two dies are placed side by side. A redistribution layer 303 supports a first 307 and a second 309 die. The redistribution layer provides a connection from the dies to external connections such as a ball grid array 305. One or both of the dies is covered by an isolation layer 311 and all of the dies are covered with a cover 313 such as a molding compound.

Figure 3B:
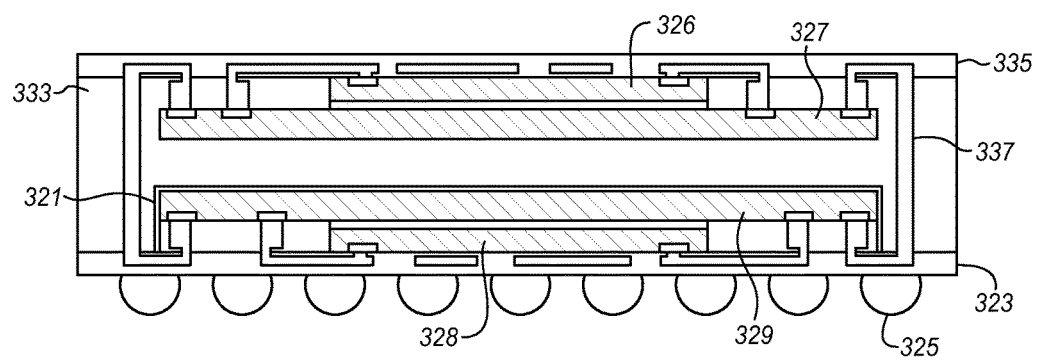
FIG. 3B is a cross sectional side view diagram of a stacked multiple chip embedded wafer level ball grid array package according to an embodiment.

FIG. 3B shows an alternative eWLB package in which the dies are stacked. A redistribution layer 323 carries a first die 328 directly coupled to the redistribution layer. A second die 329 is also coupled to the redistribution layer and is placed over the first die 328. The first and second die are isolated by an isolation layer 321. The isolation layer with the first and second dies are covered by a molding compound 333. A third die 327 and fourth die 326 are similarly connected to an upper redistribution layer 335. These two upper dies may be covered by another isolation layer or not depending on the particular implementation. The redistribution layers 333 335 are coupled together and to external connections using vias through the molding compound 333.

Figure 3C:
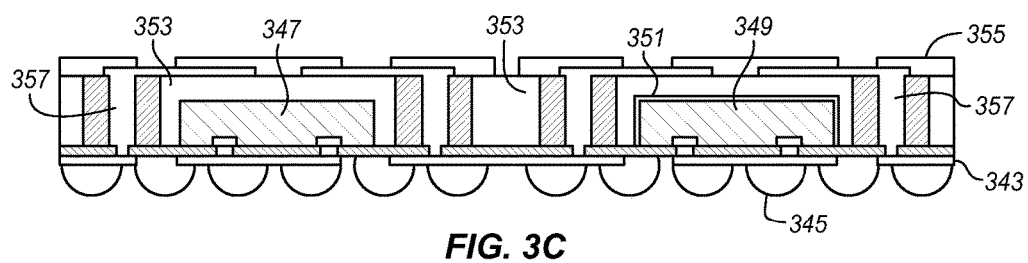
FIG. 3C is a cross sectional side view diagram of a multiple chip embedded wafer level ball grid array package with two redistribution layers according to an embodiment.

FIG. 3C shows an alternative eWLB package in a cross sectional side view diagram. A redistribution layer 343 is coupled to side by side dies 347, 349. One or both of the dies are covered by and protected by an isolation layer 351. There is a second redistribution layer 355 on top of the die and the top and bottom redistribution layers are coupled together by vias 357. The vias traverse through a molding compound 353 which isolates the dies from the vias and isolates the redistribution layers from each other. The example of FIG. 3C shows a side by side eWLB like that of FIG. 3A but in which there is a lower and an upper redistribution layer as in the example of FIG. 3B. Other variations on the packages shown and described herein are also possible.

FIG. 4A shows a more complex SiP (System in a Package) configuration in which six different dies are all coupled together within a single package. The particular dies shown in this example are provided as examples only. Different dies may be substituted for those shown and the dies may be arranged in a different way. The substrate or carrier 403 may be a silicon package substrate or a redistribution layer as in FIG. 3C or any other type of carrier. The substrate provides a connection to external components 405 such as by a ball grid array. A power management unit 407 is attached to the substrate. A connection layer 409 is formed over the power management unit to allow the power management unit to connect to other devices that are stacked on top of it. A connection layer may also be formed between the power management unit and the substrate 403. An application processor and baseband die 411 may be attached over the power management unit and connected to the power management unit through the connection layer 409. A memory die 413 may be attached and placed above the application processor to provide memory resources for the processor.

A metal shield 415 is shown as extending across the package from one end of the memory die to the other end of the memory die and across the application processor. This metal shield serves to isolate noise from the digital circuits of the memory application processor and power management unit from other components in the package.

An RF transceiver 417 is stacked over the metal isolation layer. A connection layer 409 is formed over the RF transceiver and a power amplifier 421 and front end chip 419 are placed over the connection layer. This allows the power amplifier and front end chip to connect to the RF transceiver through the connection layers 409. Filler 423 is applied in any of the open gaps between any of the dies. In addition, an additional metal shield 425 may be applied over all of the chips for further isolation from noise sources. A cover 427 surrounds all of the stacked and side by side dies to protect them from the external environment.

In this example, the SIP includes stacked components and side by side components. For example, the memory is stacked over the application processor which is stacked over the power management unit. The memory and the RF transceiver are placed side by side at one level and the power amplifier and front end chip are placed side by side at another level. This combination of stacking and side by side placement allows the dies to be combined together into a very small package. In addition, the placement of shield layers allows different types of dies to be placed close together in a single package. The particular order and position of each of the dies may be modified to suit other applications. In addition, more or fewer or different dies may be used. The particular dies shown are useful for portable wireless devices, however, other dies may be used for the same or different applications. The arrangement of FIG. 4A is provided only as an example.

FIG. 4B is a process flow diagram providing a general process for creating the packages described above. In the simplified process of FIG. 4B, a silicon substrate or redistribution layer or other type of carrier is first taken as an initial structure. At 412, one or more digital chips are placed on the carrier. At 414, one or more radio frequency chips are placed on the carrier. The order in which the chips are placed and the particular types of chips may be adapted to suit any particular implementation.

At 416, metal interconnect layers are formed to connect the chips to each other and to any external devices for example to a substrate or any other material. At 418, isolation layers are formed between the chips to protect the radio frequency chips from the noise of the digital circuits. The isolation layers may be used to shield or block any high frequency noise from interfering with the radio frequency circuits. At 420 vias are formed, depending on the particular type of package configuration, to connect the chips through the isolation layers to each other and to the metal interconnect layers. Alternatively bond wires may be placed to make similar types of connections. Interconnect and isolation layers may be formed in any order and may alternate as shown in FIG. 4A. Similarly vias may be combined with wire bonds so that different connections may be made in different ways to suit the demands of any particular type of package.

At 422, the temporary substrate or carrier may be removed depending on the particular type of package. Following the removal of the substrate or carrier, a metal interconnect, redistribution, or fan-out layer may be formed on the side of the dies from which the carrier was removed. At 424, the package is finished by attaching a cover, applying molding compound, adding additional dielectric layers, or in any other way depending on the particular type of package.

Figure 5:
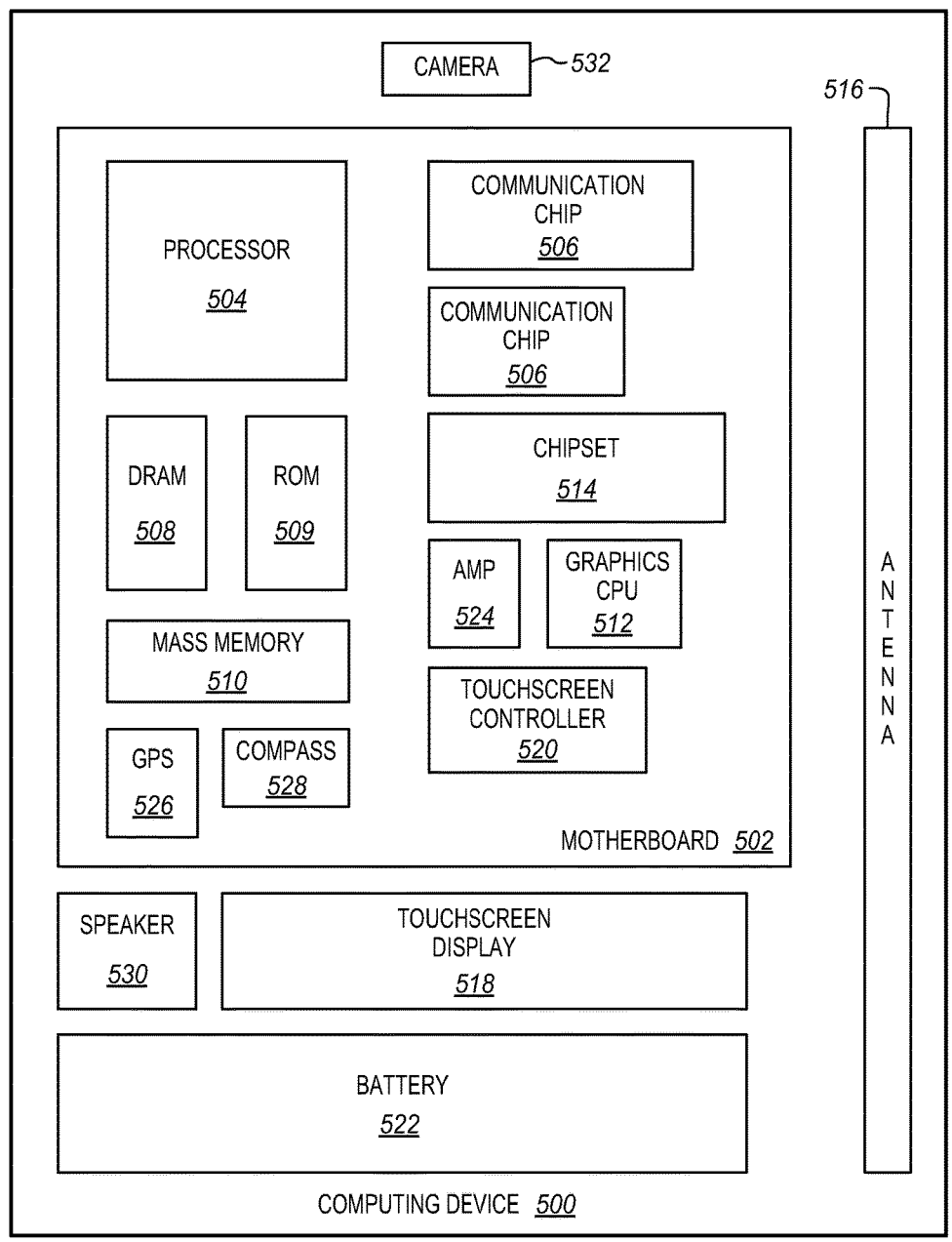
FIG. 5 is a block diagram of a computing device incorporating a multiple die package according to an embodiment.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations, the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM) 508, non-volatile memory (e.g., ROM) 509, flash memory (not shown), a graphics processor 512, a digital signal processor (not shown), a crypto processor (not shown), a chipset 514, an antenna 516, a display 518 such as a touchscreen display, a touchscreen controller 520, a battery 522, an audio codec (not shown), a video codec (not shown), a power amplifier 524, a global positioning system (GPS) device 526, a compass 528, an accelerometer (not shown), a gyroscope (not shown), a speaker 530, a camera 532, and a mass storage device (such as a hard disk drive) 510, compact disk (CD) (not shown), digital versatile disk (DVD) (not shown), and so forth). These components may be connected to the system board 502, mounted to the system board, or combined with any of the other components.

The communication chip 506 enables wireless and/or wired communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor, memory devices, communication devices, or other components include one or more dies that are packaged together using a multiple level redistribution layer, if desired. The term "processor" may refer to any device or portion of a device that processes electronic data from registers and/or memory to transform that electronic data into other electronic data that may be stored in registers and/or memory.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

In the following description and claims, the terms "chip" and "die" are used interchangeably to refer to any type of microelectronic, micromechanical, analog, or hybrid small device that is suitable for packaging and use in a computing device.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a a multiple chip package that includes a digital chip, a radio frequency chip, an isolation layer between the digital chip and the radio frequency chip, and a cover enclosing the digital chip and the radio frequency chip.

In further embodiments, the isolation layer is formed over the digital chip and adjacent to the digital chip. The isolation layer is a metallization layer. The metallization layer is formed by chemical vapor deposition over the radio frequency chip. The isolation layer is formed of copper.

Further embodiments include a redistribution layer adjacent to the isolation layer to electrically connect the digital chip to the radio frequency chip. In further embodiments, the digital chip and the radio frequency chip are stacked within the package. The digital chip is a processor and the radio frequency chip is a radio transceiver. The package includes a memory chip coupled to the processor and a radio frequency power amplifier coupled to the transceiver and the isolation layer is between the processor and the memory chip on one side and between the radio transceiver and the power amplifier on the other side.

Further embodiments include a plurality of interconnects between the digital chip and the radio frequency chip, wherein the interconnects bypass the isolation layer. Further embodiments include a plurality of interconnects between the digital chip and the radio frequency chip, wherein the interconnects pass through a respective plurality of cut openings in the isolation layer. Further embodiments include a package substrate to which the cover is attached, the package substrate being directly attached to the digital chip through a redistribution layer. Further embodiments include a ground plane connection from the isolation layer to the substrate.

Some embodiments pertain to a method that includes placing a digital chip, placing a radio frequency chip, forming an isolation layer between the digital chip and the radio frequency chip, and attaching a cover enclosing the digital chip and the radio frequency chip to form a package.

In further embodiments, placing comprises placing over a carrier, the method further comprising removing the carrier after forming the isolation area. Further embodiments include forming vias through the isolation layer to electrically connect the digital chip and the radio frequency chip. Further embodiments include forming a redistribution layer after forming the isolation layer to connect the digital chip and the radio frequency chip to external components.

In further embodiments, placing the radio frequency chip comprises placing the radio frequency chip beside the digital chip on a common substrate. Placing the radio frequency chip comprises placing the radio frequency chip over the digital chip and the isolation layer so that the radio frequency chip is stacked on the digital chip. Further embodiments include forming a redistribution layer over the radio frequency chip.

Some embodiments pertain to a computing system with a user interface controller, an antenna, and a multiple chip package having a digital chip coupled to the user interface controller, a radio frequency chip, coupled to the antenna, an isolation layer between the digital chip and the radio frequency chip, and a cover enclosing the digital chip and the radio frequency chip. In further embodiments the isolation layer is a metallization layer formed over the digital chip by deposition.

What is claimed is:

1. A multiple chip package comprising:
   a first chip;
   a second chip;
   an isolation structure between the first chip and the second chip;
   a first redistribution layer adjacent the first chip, wherein the first chip is connected to the first redistribution layer;
   a molding compound partially enclosing first chip and the second chip;
   wherein the first redistribution layer provides a connection between the first chip and a ball grid-array ball; and
   wherein the first redistribution layer provides a connection between the second chip and a ball-grid array ball.

2. The package of claim 1, wherein the isolation structure is formed over the first chip and adjacent to the first chip, and wherein the first chip is a digital first chip.

3. The package of claim 2, wherein the isolation structure is a metallization layer.

4. The package of claim 3, wherein the metallization layer is formed by chemical vapor deposition over the second chip.

5. The package of claim 3, wherein the isolation structure is formed of copper.

6. The package of claim 1, wherein the second chip is a radio frequency second chip.

7. The package of claim 1, wherein the first chip and the second chip are stacked within the package.

8. The package of claim 1, wherein the first chip is a processor and the and the second chip is a radio transceiver, the package further comprising a memory chip coupled to the processor and a radio frequency power amplifier coupled to the transceiver and wherein the isolation structure is between the processor and the memory chip on one side and between the radio transceiver and the power amplifier on the other side.

9. The package of claim 1, further comprising a plurality of interconnects between the first chip and the second chip, wherein the interconnects bypass the isolation structure.

10. The package of claim 1, further comprising a plurality of interconnects between the first chip and the second chip, where the interconnects pass through a respective plurality of cut openings in the isolation structure.

11. The package of claim 1, further comprising a package substrate to which the molding compound is attached, the package substrate being directly attached to the first chip through a redistribution layer.

12. The package of claim 1, further comprising a ground plane connection from the isolation structure to the substrate.

* * * * *

UNITED STATES PATENT AND TRADEMARK OFFICE
CERTIFICATE OF CORRECTION

PATENT NO. : 10,135,481 B2
APPLICATION NO. : 15/174545
DATED : November 20, 2018
INVENTOR(S) : Goetz et al.

Page 1 of 1

It is certified that error appears in the above-identified patent and that said Letters Patent is hereby corrected as shown below:

In the Claims

In Column 10, Line 13, in Claim 8, after "processor", delete "and the"

Signed and Sealed this
Twenty-first Day of April, 2020

Andrei Iancu
*Director of the United States Patent and Trademark Office*